(12) United States Patent
Forrest et al.

(10) Patent No.: US 9,270,086 B2
(45) Date of Patent: Feb. 23, 2016

(54) ORGANIC LASER

(75) Inventors: Stephen R. Forrest, Ann Arbor, MI (US); Stephane Kena-Cohen, Ann Arbor, MI (US); Noel Giebink, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 872 days.

(21) Appl. No.: 12/511,797

(22) Filed: Jul. 29, 2009

(65) Prior Publication Data

US 2011/0026553 A1 Feb. 3, 2011

(51) Int. Cl.
| H01S 5/00 | (2006.01) |
|---|---|
| H01S 5/36 | (2006.01) |
| H01S 5/04 | (2006.01) |
| H01L 51/50 | (2006.01) |
| H01S 5/183 | (2006.01) |

(52) U.S. Cl.
CPC . *H01S 5/36* (2013.01); *H01S 5/041* (2013.01); *H01L 51/50* (2013.01); *H01S 5/183* (2013.01)

(58) Field of Classification Search
None
See application file for complete search history.

(56) References Cited

U.S. PATENT DOCUMENTS

| 2,949,616 | A | 8/1960 | Desanges |
|---|---|---|---|
| 3,473,502 | A | 10/1969 | Wittkamp |
| 4,739,507 | A | 4/1988 | Byer et al. |
| 5,164,947 | A | 11/1992 | Lukas et al. |
| 5,182,759 | A | 1/1993 | Anthon et al. |
| 5,513,204 | A | 4/1996 | Jayaraman |
| 5,524,570 | A | 6/1996 | Kaye |
| 5,707,745 | A | 1/1998 | Forrest et al. |
| 5,761,227 | A | 6/1998 | Hargis et al. |
| 5,844,363 | A | 12/1998 | Gu et al. |
| 6,111,902 | A | 8/2000 | Kozlov et al. |
| 6,160,273 | A | * 12/2000 | Fork et al. ............ 257/98 |
| 6,164,237 | A | 12/2000 | Coryell |
| 6,303,238 | B1 | 10/2001 | Thompson et al. |
| 6,466,709 | B1 | 10/2002 | Scherer |
| 6,658,037 | B2 | 12/2003 | Kahen et al. |
| 6,879,618 | B2 | 4/2005 | Cok et al. |

(Continued)

FOREIGN PATENT DOCUMENTS

| EP | 0636282 | 6/1996 |
|---|---|---|
| EP | 1249903 | 10/2002 |

OTHER PUBLICATIONS

V. G. Kozlov et al. "Laser action in organic semiconductor waveguide and double-heterostructure devices" Nature 389, p. 362 (1997).

(Continued)

*Primary Examiner* — Jessica Stultz
*Assistant Examiner* — Sean Hagan
(74) *Attorney, Agent, or Firm* — Riverside Law LLP

(57) ABSTRACT

A device is provided. The device includes a first organic light emitting device, which further comprises a first electrode, a second electrode, and an organic emissive layer disposed between the first electrode and the second electrode. The device also includes a first laser device, which further comprises an optical cavity and an organic lasing material disposed within the optical cavity. A focus mechanism is disposed to focus light emitted by the first organic light emitting device onto the first laser device. Preferably, the focus mechanism provides light incident on the first laser device at least 10 times greater, and more preferably at least 100 times greater, in intensity than the light emitted by the first organic light emitting device.

19 Claims, 20 Drawing Sheets

(56) References Cited

U.S. PATENT DOCUMENTS

| | | | |
|---|---|---|---|
| 7,260,133 | B2 | 8/2007 | Lei et al. |
| 7,279,704 | B2 | 10/2007 | Walters et al. |
| 2006/0078031 | A1* | 4/2006 | Govorkov et al. ............ 372/69 |
| 2007/0171953 | A1* | 7/2007 | Shur et al. .................. 372/71 |

OTHER PUBLICATIONS

Toshinori Matsushima et al., "High-current Injection and Transport on Order of kA/cm2 in Organic Light-emitting Diodes Having Mixed Organic/Organic Heterojunction Interfaces", Japanese Journal of Applied Physics, vol. 46, No. 35, 2007, pp. L861-L863.

C. I. Wilkinson et al., "Enhanced performance of pulse driven small area polyfluorene light emitting diodes," Applied Physics Letters, vol. 79, No. 2, Jul. 9, 2001, pp. 171-173

Giebink and Forrest, "Temporal response of optically pumped organic semiconductor lasers and its implication for reaching threshold under electrical excitation," Phys. Rev. B 79, 073302 (2009).

Riedl et al., "Tunable organic thin-film laser pumped by an inorganic violet diode laser" Applied Physics Letters 88, 241116, 2006.

Samuel et al., "Organic Semiconductor Lasers" Chem. Rev., 2007, 107 (4), 1272-1295.

Yang et al., "Hybrid optoelectronics: A polymer laser pumped by a nitride light-emitting diode" Applied Physics Letters 92, 163306, 2008.

Wei et al., "Organic solid laser pumped by an organic light-emitting diode" Oct. 2006/vol. 14, No. 20/Optics Express 9436.

The Search Report corresponding to the PCT/US2010/061349 application.

International Search Report in PCT/US2010/043680 application.

* cited by examiner

ORGANIC LASER

This invention was made with government support under Grant No. FA9550-07-0364, Project No. F017357 awarded by the Air Force Office of Scientific Research. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices. More specifically, the present invention relates to lasers, where the lasing material is organic.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

More details on OLEDs, and the definitions described above, can be found in U.S. Pat. No. 7,279,704, which is incorporated herein by reference in its entirety.

SUMMARY OF THE INVENTION

A device is provided. The device includes a first organic light emitting device, which further comprises a first electrode, a second electrode, and an organic emissive layer disposed between the first electrode and the second electrode. The device also includes a first laser device, which further comprises an optical cavity and an organic lasing material disposed within the optical cavity. A focus mechanism is disposed to focus light emitted by the first organic light emitting device onto the first laser device. Preferably, the focus mechanism provides light incident on the first laser device at least 10 times greater, and more preferably at least 100 times greater, in intensity than the light emitted by the first organic light emitting device.

Preferably, the first organic light emitting device has a microcavity, such that the organic emissive layer is disposed within the microcavity. One dimensional and two dimensional microcavities are two types of microcavities that may be used.

The focus mechanism may be a lens, such as a gradient index lens. A gradient index lens may have a cylindrical shape having a first planar end and a second planar end, where the first organic light emitting device is disposed on the first planar end of the gradient index lens, and the first laser device is disposed on the second planar end of the gradient index lens. Quarter pitch gradient index lenses are preferred.

The focus mechanism may be a non-planar substrate on which the first organic light emitting device is disposed, such that light from the first organic light emitting device is focused into a region in which at least a part of the first organic semiconductor laser is disposed. A non-planar substrate having three dimensional curvature is preferred. A parabolic shape is preferred.

Preferably, the device further comprising circuitry adapted to pulse the first organic light emitting device.

The device may be incorporated into a consumer device.

A method is also provided. The first organic light emitting device may be electrically driven, resulting in electroluminescence. The electroluminescence may be focused onto the organic semiconductor laser by the focus mechanism, which optically pumps the organic semiconductor laser.

Preferably, the first organic light emitting device is driven in pulses, such that the OSL is optically pumped in pulses. Preferably, the pulses have a duration of 5 to 20 nanoseconds. Preferably, the intervals between pulses have a duration of at least one microsecond.

DETAILED DESCRIPTION

Figure 1:
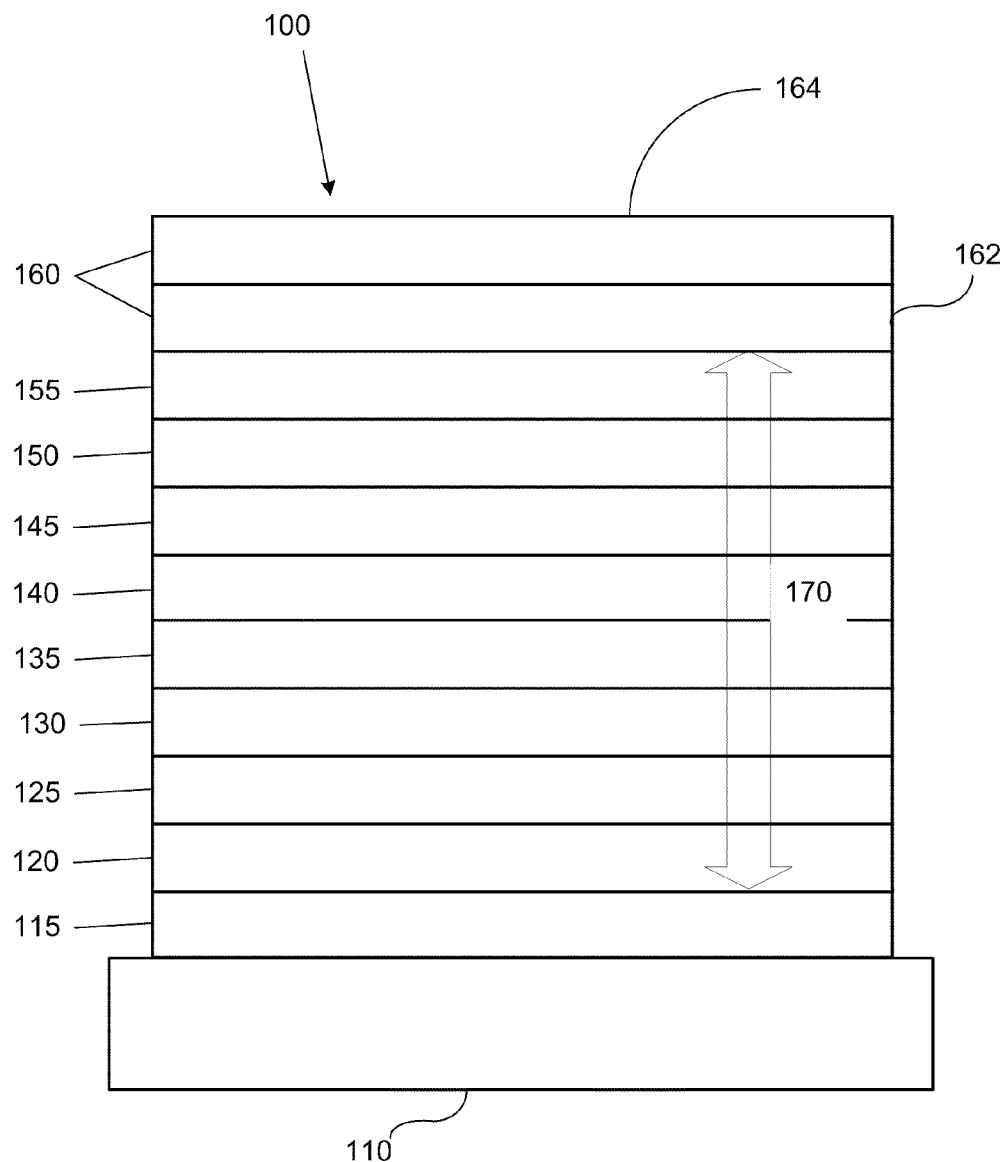
FIG. 1 shows an organic light emitting device.

An optically pumped organic semiconductor laser (OSL) is provided. The OSL is pumped by light from a separate, electrically driven organic light emitting device (OLED).

Optically pumped OSL devices are known, see V. G. Koslov, P. E. Burrows, and S. R. Forrest, Nature 389, p. 362 (1997). An OSL generally includes an optical cavity having an organic lasing material disposed therein. Considerations such as how to make the optical cavity, where the lasing material should be placed, and what materials should be used, are well known to the art. An OSL may be optically pumped by providing light incident on the OSL having a sufficient intensity at wavelengths that the OSL is able to absorb. For conventional optically pumped OSL devices having the lowest optical pumping threshold to achieve lasing, a pump intensity on the order of 100 W/cm$^2$ is needed. The highest brightness achieved in presently available OLEDs is on the order of 10 W/cm$^2$. Thus, without about a factor of 10 increase in the output intensity, a conventional OLED will not be able to drive an optically pumped OSL at the level needed to achieve lasing.

Embodiments of the invention address this problem by providing a focus mechanism that focuses the light output from an OLED onto an optically pumped OSL, providing a region of decreased area, but increased intensity, light relative to the default output of the OLED. This increased intensity is sufficient to achieve lasing in conventional optically pumped OSLs with conventional OLEDs. Preferably, the intensity of light incident on the OSL is at least 10 times greater than the intensity of light emitted by the OLED, based on the increase in intensity needed to drive existing OSL devices with existing OLEDs. More preferably, the intensity of light incident on the OSL is at least 100 times greater than the intensity of light emitted by the OLED, and even more preferably 1,000 times greater. These increases are achievable based on configurations disclosed herein, and provide a comfortable margin for achieving lasing with devices and materials that may not be the brightest OLEDs or the OSL devices with the lowest lasing thresholds. Other increases in the intensity of light may be used, depending on factors such as the characteristics of available OLEDs and OSLs.

The "focus mechanism" may be any mechanism that focuses light. In some embodiments of the invention, one or more lenses is used to achieve such focus. A gradient index lens (GRIN lens) is a preferred focus mechanism. With a GRIN lens, it is possible to easily manufacture a convenient unit that includes the OLED, the OSL and the GRIN lens. A cylindrically shaped GRIN lens has two circular planar ends. An OLED may be positioned on one of these ends, and an OSL on the other, such that the GRIN lens focuses light from the OLED onto the OSL. This configuration has the advantage that the distance between the OLED and the OSL, which affects the degree of focus and the intensity increase, is readily controllable during manufacture of the GRIN lens. A quarter pitch GRIN lens is preferred, because quarter pitch GRIN lens achieves a high degree of focus over a small distance relative to GRIN lenses having other pitches.

For some embodiments, it is preferred that the OLED include a microcavity. In a microcavity OLED, the emissive layer of the OLED is disposed within a microcavity, i.e., between two surfaces that are at least semi-reflective. An OLED with no microcavity effect may have roughly "Lambertian" emission, i.e., the radiant intensity observed is directly proportional to the cosine of the angle θ between the observer's line of sight and the surface normal. Microcavity effects tend to concentrate the radiant intensity in the direction of the surface normal, resulting, in the limit, in "collimated" emission. Often, OLEDs having a microcavity use the interfaces between the electrodes of the OLED and the organic layers as the semi-reflective surfaces, although it is possible to use other surfaces as well.

In particular, some focus mechanisms may work best when the emission of the OLED is directional, and preferably collimated. A GRIN lens is an example of such a focus mechanism.

Another focus mechanism involves the use of a non-planar or curved substrate on which the OLED is fabricated. For example, using OLEDs having collimated emission, each part of the OLED will emit light in the direction of the surface normal. By shaping the curved substrate such that these surface normals converge onto a small area at a particular spot, focus onto an OSL from an OLED may be achieved without the use of a lens. It is not necessary to position the OSL at the place where the highest degree of focus is reached, although it may be desirable. Rather, it is preferred to position the OSL such that the light is at least sufficiently focused to drive the OSL.

A non-planar substrate having three dimensional curvature is preferred. A parabolic shape is preferred. Surfaces having two dimensional curvature may be used, and may be preferred for some reasons, such as ease of manufacture. However, surfaces having two dimensional curvature are limited in their ability to focus light to a point, and rather may focus light into a linear region. Surfaces having three dimensional curvature are preferred because greater increases in intensity may be achieved. Parabolic shapes are preferred, where the OSL is located at or near the focus of the parabola. A parabolic dish is an example of a preferred shape.

Preferably, the device further comprising circuitry adapted to pulse the first organic light emitting device. Pulsing is preferred because it is believed that an OSL, when continuously lased, may experience a build up of triplets that cause undesirable quenching. See, Giebink and Forrest, *Temporal response of optically pumped organic semiconductor lasers and its implication for reaching threshold under electrical excitation*, Phys. Rev. B 79, 073302 (2009). Using a pulsed optical pump to drive the OSL may mitigate this issue. The circuitry adapted to pulse the first organic light emitting device can be, for example, a commercially available pulse generator. It is believed that triplets build up to undesirable levels in some OSL devices over a time of about 100 ns. Pulse durations of less than 100 ns are therefore preferred. Preferably, the pulses have a duration of 5 to 20 nanoseconds. A pulse may include a rise time, during which the intensity of the OLED increases, which is preferably as short as possible. An interval between pulses allows triplets to decay, such that another pulse may be initiated. Preferably, the interval between pulses is at least ne microsecond. Longer intervals may be used, up to one second or longer. Different pulse durations and intervals between pulses may be used, depending upon the materials and configuration of the OSL. In addition, less than optimal durations for the pulses and intervals may be used, for example as a trade-off between lasing efficiency and a desired laser signal profile.

The focus mechanism is not limited to those specifically illustrated herein. Other suitable focus mechanisms include a conventional lens, a Fresnel lens, a microscope objective, a concave or parabolic mirror, or a combination of optical elements. More generally, any optical element or combination of optical elements that can focus light may be used.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

Arrow 170 illustrates the boundaries of a microcavity in device 100. A microcavity is formed between two interfaces in a device, when those interfaces have at least some degree of reflectivity. One of the interfaces may be completely reflective. However, because the OLED is expected to emit light, at least one of the interfaces should be semi-transparent. Arrow 170 is drawn between the interfaces of the organic layers of device 100 with anode 115 and cathode 160. These interfaces typically define any microcavity that is present in an OLED, because they tend to have the highest reflectivities in the device when typical design choices are made. However, other interfaces may be used to define the microcavity.

Figure 2:
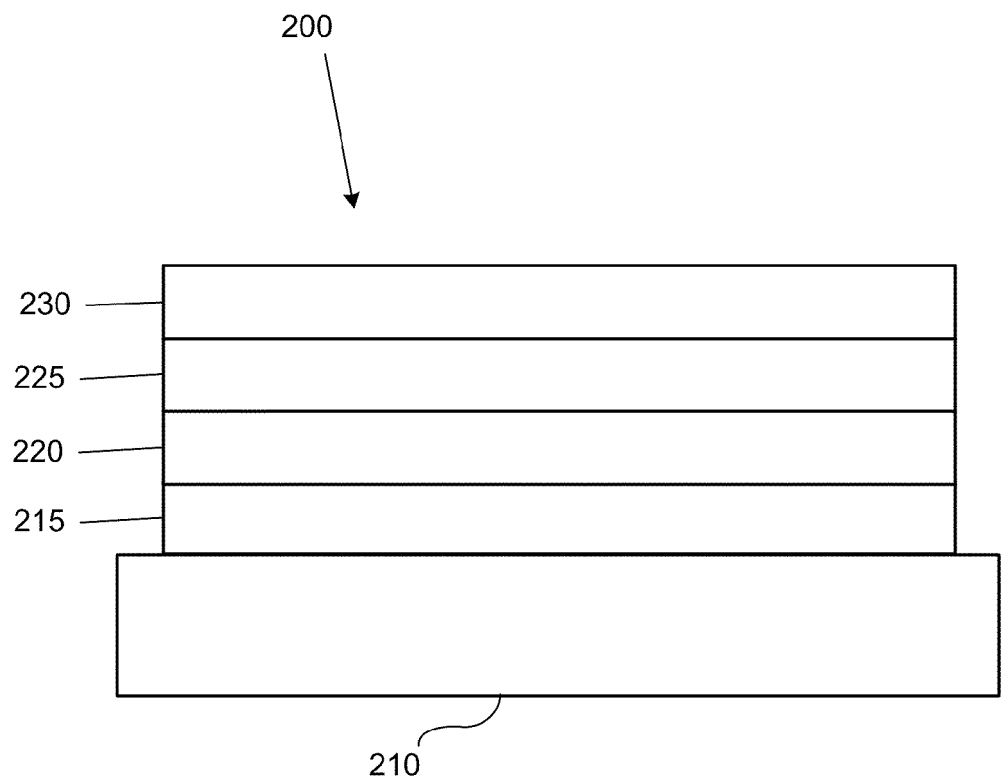
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Various layers may comprise a single material, or a mixture of host and dopant, or more generally a mixture. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Figure 3:
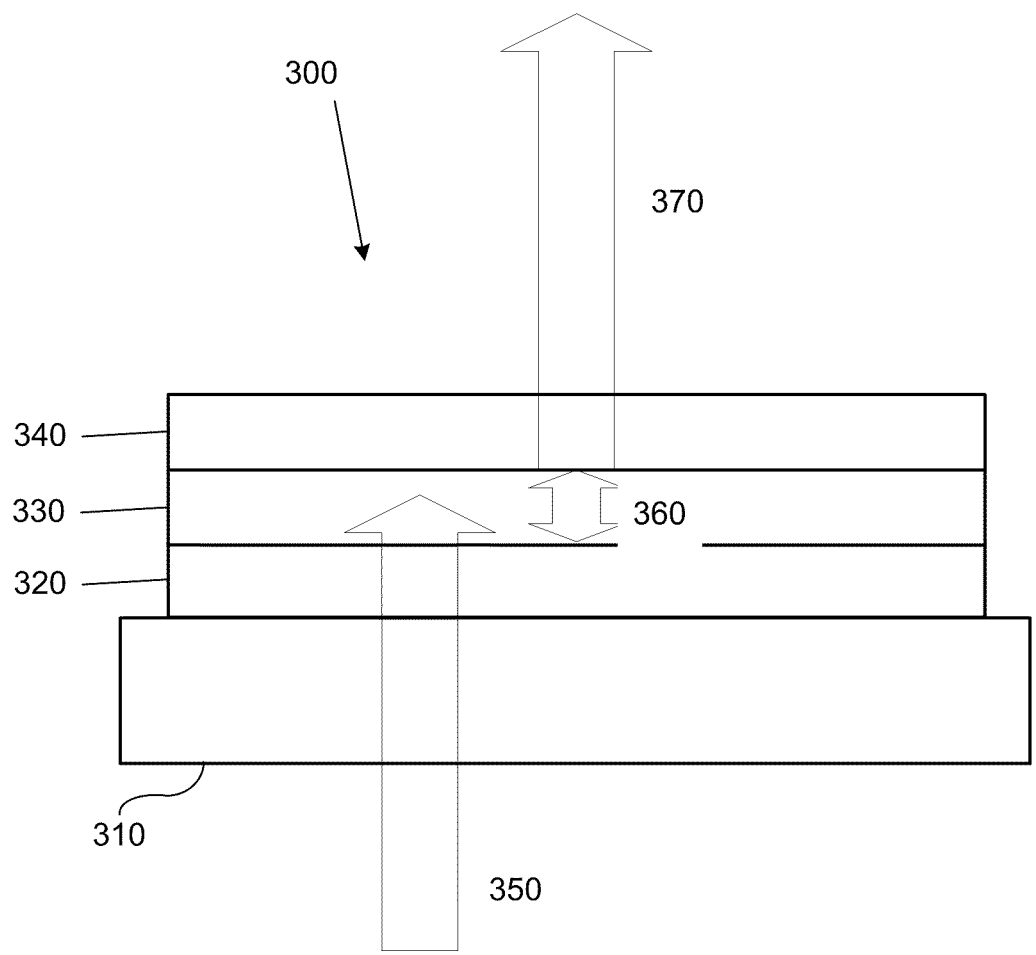
FIG. 3 shows an optically pumped organic semiconductor laser.

FIG. 3 shows an optically pumped organic semiconductor laser (OSL) 300. Laser 300 is fabricated on a substrate 310. Laser 300 includes first semi-reflective layer 320 and second semi-reflective layer 330, which together define an optical cavity. Organic lasing material 330 is disposed within the optical cavity. In the context of an OSL, "optical cavity" as used herein means any structure that provides an environment suitable for the organic lasing material to laser when optically pumped. Incident light 350 is used to pump lasing material 330. Preferably, lasing material 330 has a high absorption coefficient for the dominant wavelengths of incident light 350. Incident light 350, when absorbed by lasing material 330, excites the molecules of lasing material 330. These excited molecules subsequently decay, creating photons having the wavelength of the laser light to be emitted. These photons may bounce back and forth in the optical cavity, as illustrated by double arrow 360. Some of these photons become laser light 370 emitted by laser 300. Optically pumped OSL devices are well known in the art. Specific configurations different from that shown in FIG. 3 may be used. Design criteria for an optically pumped OSL, such as various material combinations, matching the optical path length of the optical cavity to a multiple of the wavelength of light to be emitted, the degree of reflectivity for the semi-reflective layers, and the like, are well-known in the art.

Figure 4:
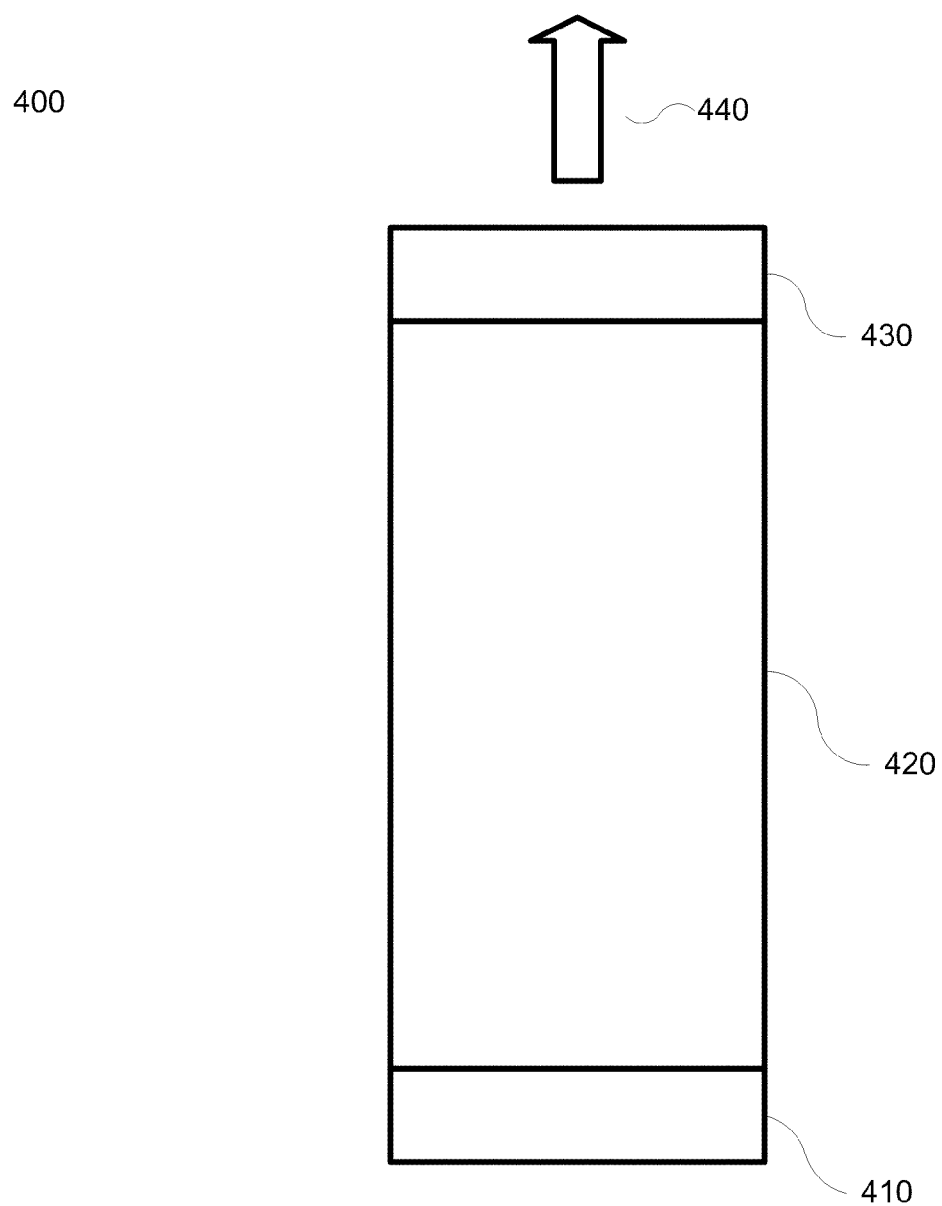
FIG. 4 shows a gradient index (GRIN) lens as a focus mechanism to focus light from an OLED onto an OSL.

FIG. 4 shows an embodiment of the invention that uses a gradient index (GRIN) lens as a focus mechanism to focus light from an OLED onto an OSL. Device 400 includes a GRIN lens 420. A GRIN lens is generally in the shape of a cylinder, and may be manufactured using methods similar to those used for optic fiber. An OLED 410 is disposed on a first planar end of GRIN lens 420. An OSL 430 is disposed on a second planar end of GRIN lens 420. When electrical power is provided to OLED 410, it electroluminesces. Light from OLED 410 enters GRIN lens 420, where it is focused onto an area of OSL 410. The area of OSL 410 onto which the light is focused is significantly smaller than the area of OLED 410 from which the light is provided. As a result, the light focused onto OSL 410 has an intensity that is significantly higher than that emitted by OLED 410. The increase in intensity may be controlled by selecting parameters for the GRIN. An increase of a factor of at least 10 is preferred for most situations. Increases by a factor of at least 100 or at least 1000 are also readily achievable, and may be desirable. An increase in intensity of not more than 10,000 should be suitable for most embodiments. The optical pumping of OSL 430 results in the emission of coherent laser light 440.

Figure 5:
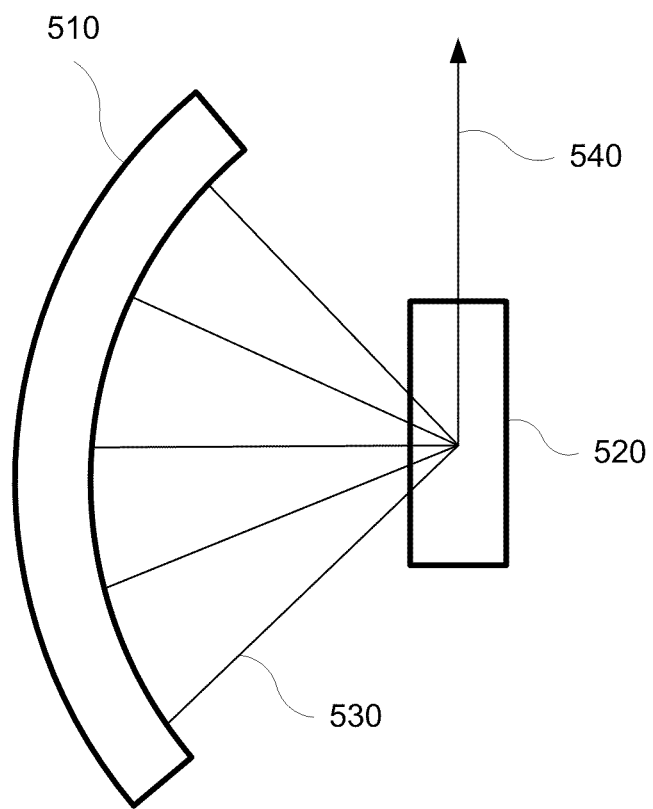
FIG. 5 shows a curved OLED as a focus mechanism to focus light from an OLED onto an OSL.

FIG. 5 shows an embodiment of the invention that uses a curved OLED as a focus mechanism to focus light from an OLED onto an OSL. An OLED is fabricated on a curved substrate 510. Substrate 510 is curved such that light 530 from the OLED converges on an area of OSL 520 that is significantly smaller than the emitting area of the OLED. Light 530 optically pumps OSL 520, resulting in the emission of laser light 540. The preferred ranges for the ratio of the emitting area of OLED 510 and the area of OSL 520 onto which light is focused is the same as for the embodiment described with respect to FIG. 4.

Figure 6:
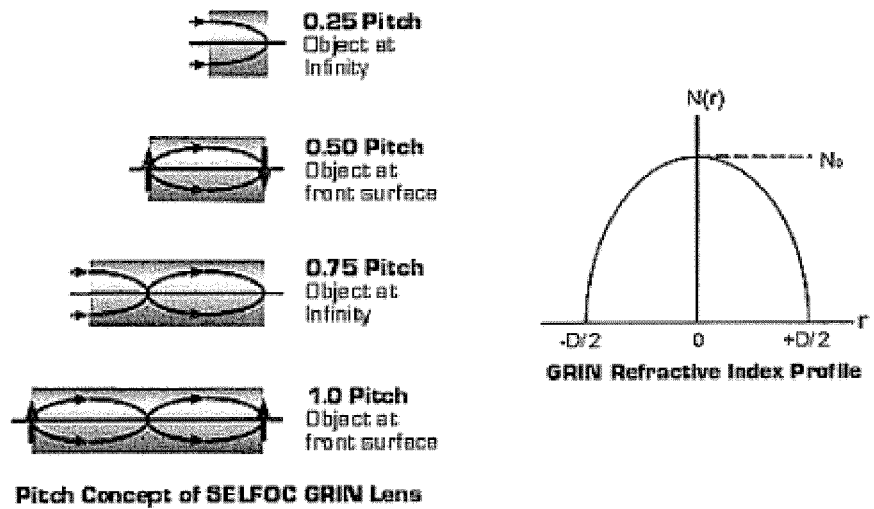
FIG. 6 shows the pitch concept of a GRIN lens.

FIG. 6 illustrates the pitch concept of a GRIN lens. A GRIN lens generally has a pitch. Uniform collimated light entering the end of a GRIN lens will converge to a small regions at certain distances along the length of the GRIN lens, and will diverge again at other distances along the GRIN lens. For use in the embodiment of FIG. 4, for example, it is preferred to select a GRIN lens having a length such that widespread collimated light entering one end of the lens will be focused to the extent preferred at the other end of the lens. There may be various ranges of length that are preferred, because it is not necessary to focus all of the light to a point in order to achieve the desired increase in intensity. FIG. 4 also shows one way in which the index of refraction may vary across the diameter of a GRIN lens. The particular profile illustrated in FIG. 4 is a quadratic index profile with an index $N_0$ in the center and an index of zero at the edges, for a SELFOC GRIN lens. SELFOC is the trade name for a low-cost GRIN lens available from NSG America, Inc.

Figure 7:
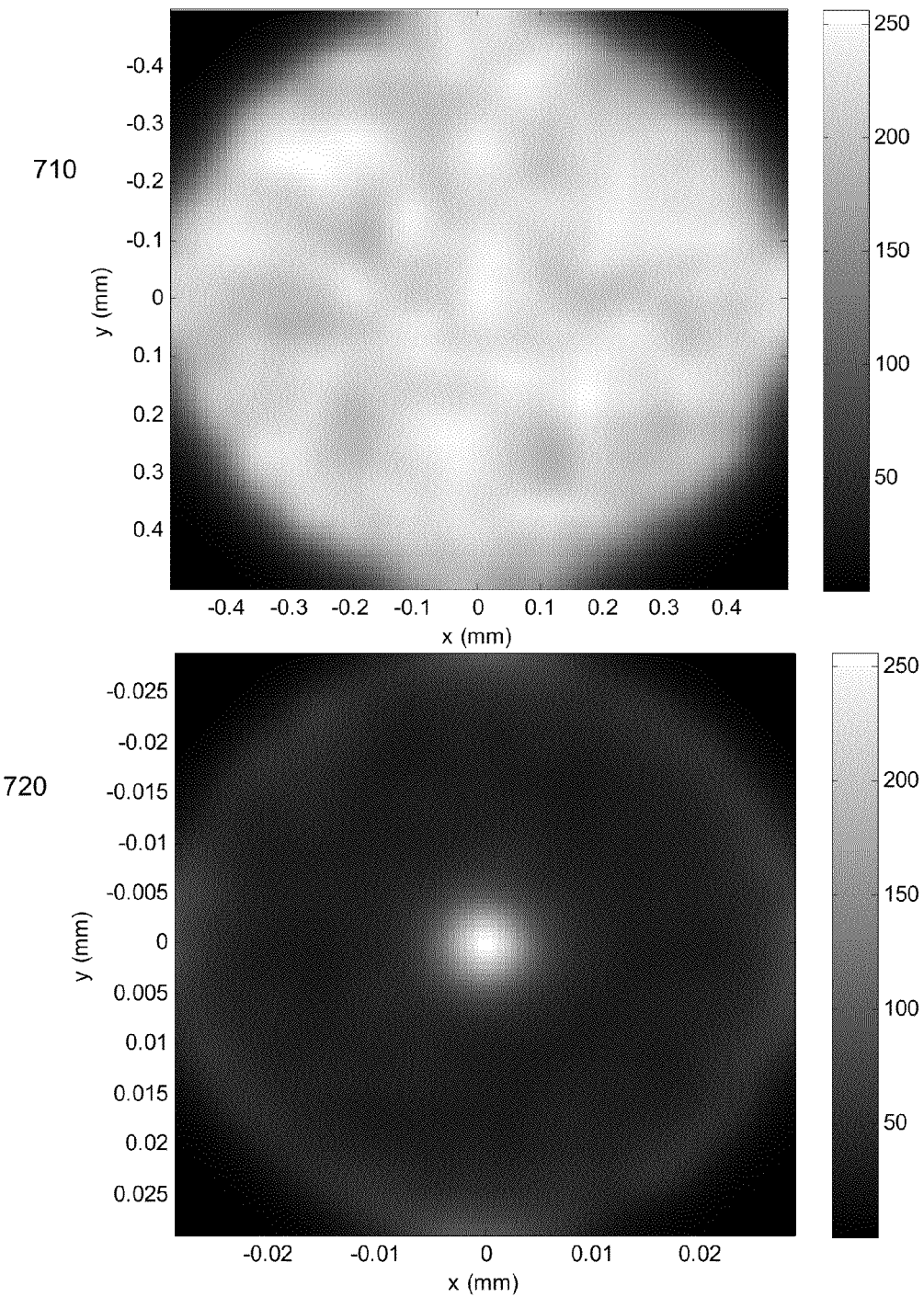
FIG. 7 shows a uniform input intensity profile and a calculated output intensity profile for a GRIN lens, assuming collimated input light.

FIG. 7 shows a uniform input intensity profile, and a calculated output intensity profile, for a GRIN lens. The parameters for the calculation as follows. The lens had a quadratic profile as illustrated in FIG. 6, with $N_0=1.607$, diameter D=1 mm, length L=2.58 mm with a quadratic index profile. The lens had a gradient constant A of 0.608, which determines the steepness of the parabolic index profile.

The output profile was calculated by solving inhomogeneous ray propagation equations exactly (not paraxial). These equations are nonlinear coupled ordinary differential equations (ODE):

$$\frac{d^2x}{d^2z} = \frac{1}{2n(x_i, y_i)\cos(\gamma)} \frac{\partial(n^2(r^2))}{\partial x}$$

$$\frac{d^2x}{d^2z} = \frac{1}{2n(x_i, y_i)\cos(\gamma)} \frac{\partial(n^2(r^2))}{\partial y}$$

It was assumed that the input light was collimated. Profile 710 shows the uniform input intensity. Profile 720 shows the output intensity. The area in which most of the light was focused in the output intensity plot was reduced by a factor of $10^4$ relative to the area of the input intensity plot, and the intensity of light in the output plot was correspondingly higher. Using a uniform input intensity of 10 W/cm², which is readily achievable with conventional OLEDs, the average output intensity is 100,000 W/cm². This is well in excess of the 100 W/cm² desirable to optically pump a conventional OSL.

Figure 8:
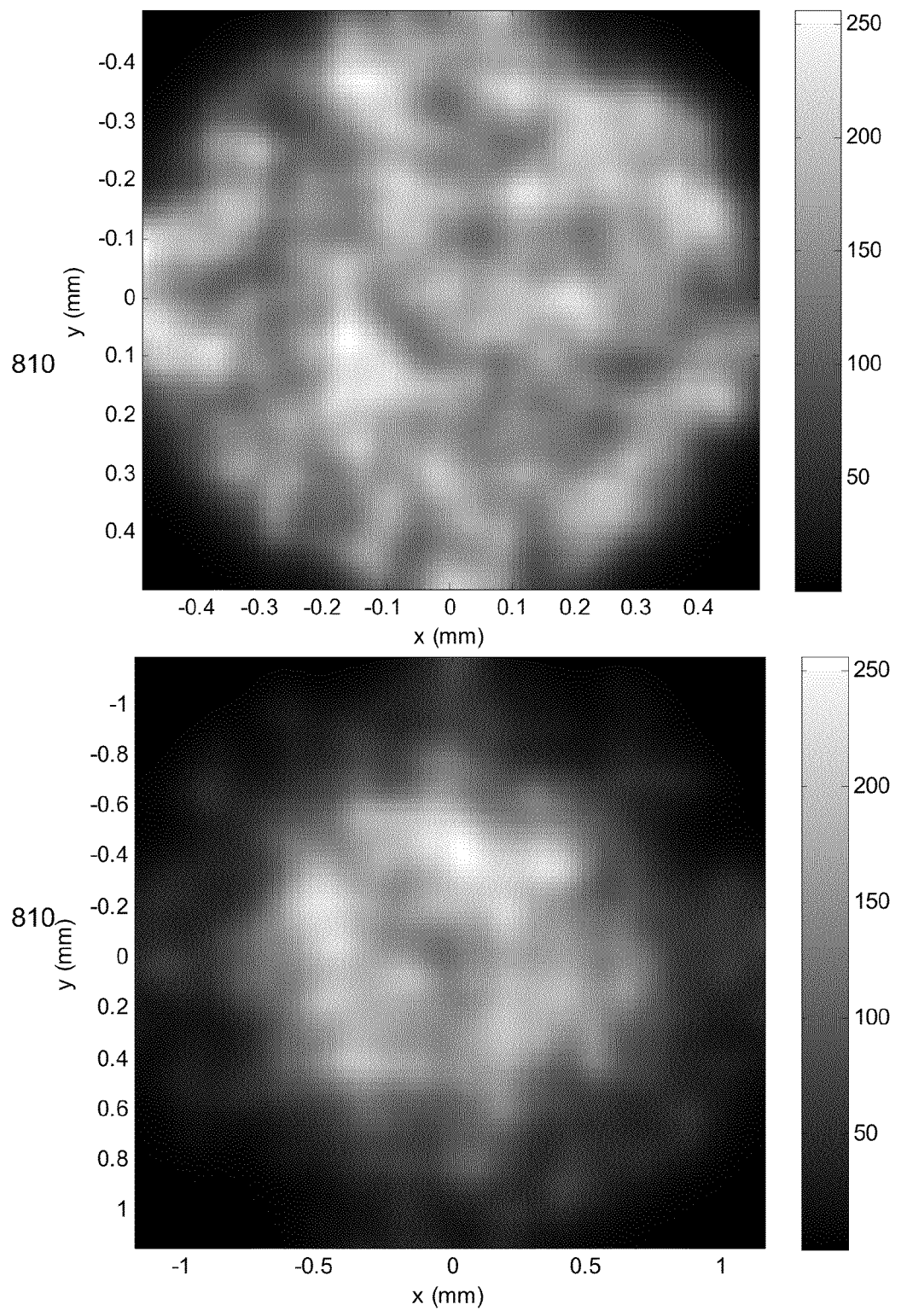
FIG. 8 shows a calculation similar to that illustrated in FIG. 7, but assuming that the input light had an isoptropic angular distribution on a half sphere.

FIG. 8 shows a calculation similar to that illustrated in FIG. 7, except instead of assuming that the input light is collimated, it was assumed that the input light had an isotropic angular distribution on a half sphere. The "isotropic" input was simulated by using 1000 simulated rays having an isotropic probability distribution function. Due to the small number of rays, some local variations in intensity may be observed, but these do not significantly affect the comparison between the intensity increases that may be achieved with isotropic and collimated input. Profile 810 shows the input intensity profile, and profile 821 shows the output intensity profile. The improvement in the intensity of the output light was much less than illustrated in FIG. 7. This calculation shows that it is desirable to use collimated input light, or at least light having a degree of collimation. Such collimated light is readily achieved in the OLED context by using an OLED having an appropriate microcavity.

Figure 9:
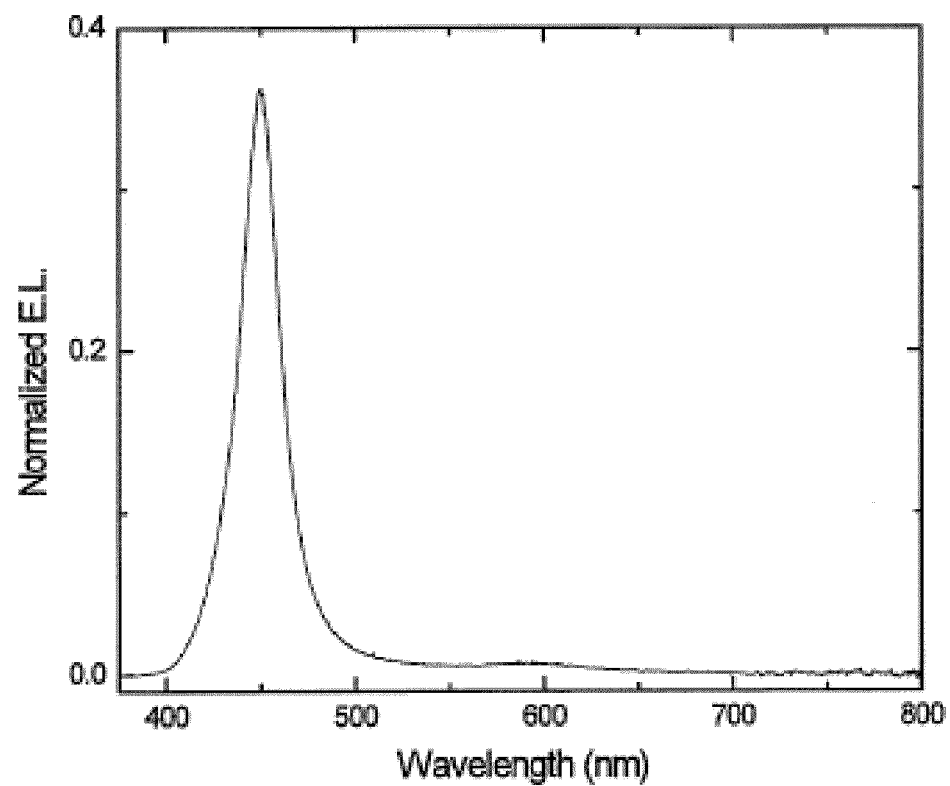
FIG. 9 shows a measured, normalized EL spectra for a first OLED.

A first OLED was fabricated as follows. On a 2.5 p distributed Bragg reflector (DBR), an OLED was fabricated. The OLED comprised the following layers, in order: 140 nm sputtered indium tin oxide (ITO)/500 nm NPD/150 nm BCP/300 nm Alq/LiF/Al. The DBR had 2.5 quarter wavelength pairs, i.e., 3 layers of 547 Å thick $SiN_x$, with two interposed 762 Å thick layers of $SiO_2$. The OLED has a microcavity as a result of the DBR and the Al electrode (the thickness of the LiF/Al electrode is not relevant—it is thick enough to be completely reflective and to adequately conduct electricity). The OLED was designed to emit light having a peak in the emission spectra at 450 nm. FIG. 9 shows a measured, normalized EL spectra for the OLED.

Figure 10:
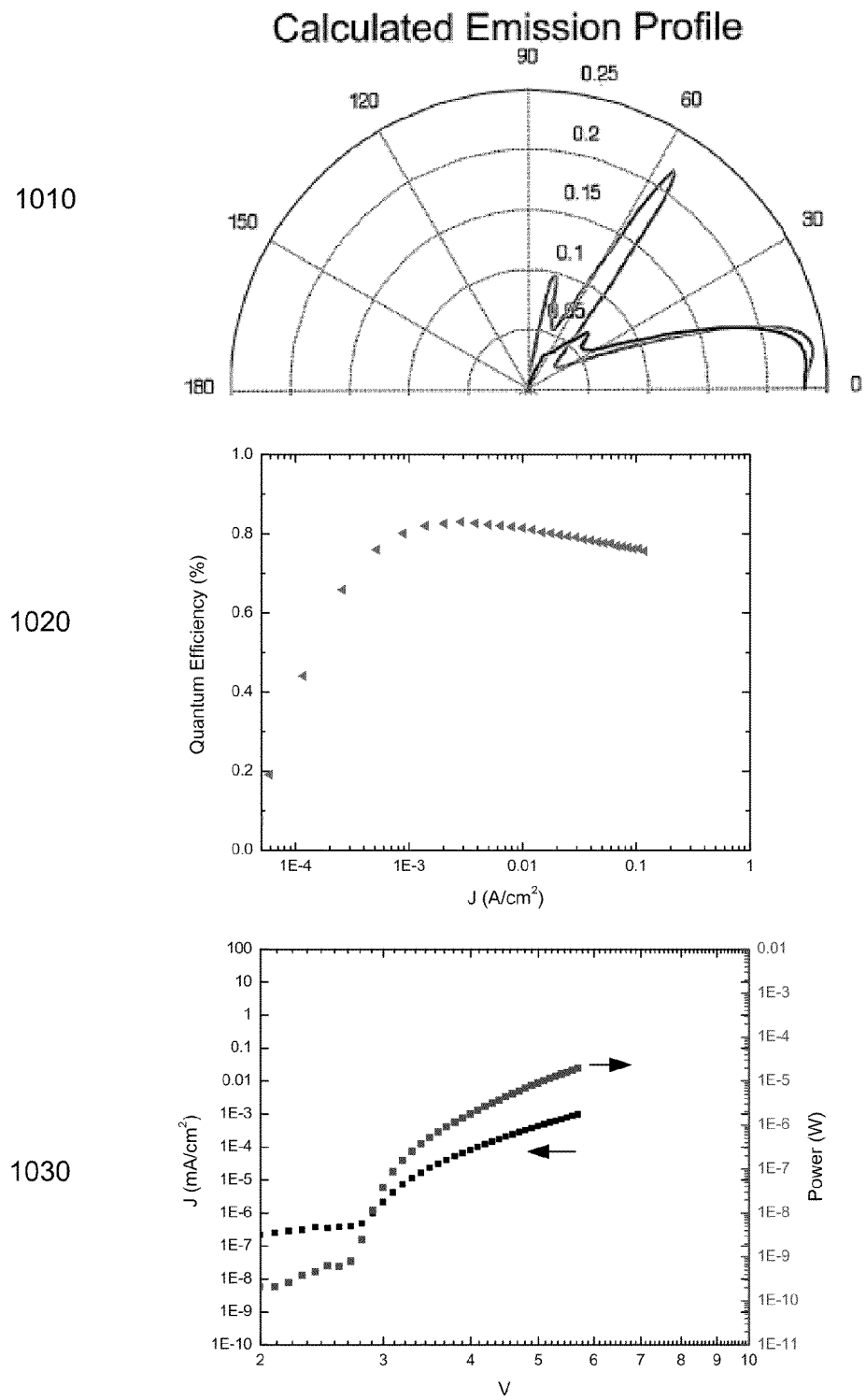
FIG. 10 shows plots characterizing the first OLED.

FIG. 10 shows a calculated emission profile 1010 for the OLED of FIG. 9. The peak at an angle of zero shows that the emission profile is highly collimated. FIG. 10 also shows a plot 1020 of measured quantum efficiency (QE) vs. current flux J (A/cm²), as well as a plot 1030 of power (W) and flux J (A/cm²) vs. voltage V for the first OLED.

A second OLED was fabricated as follows. On a glass substrate, the following layers were deposited in order: 125 nm sputtered ITO/500 nm NPD/150 nm BCP/300 nm Alq/LiF/Al. The ITO was sputtered at 80 W with 0.1 sccm $O_2$ and 140 sccm Ar, and then annealed for 3 hours.

Figure 11:
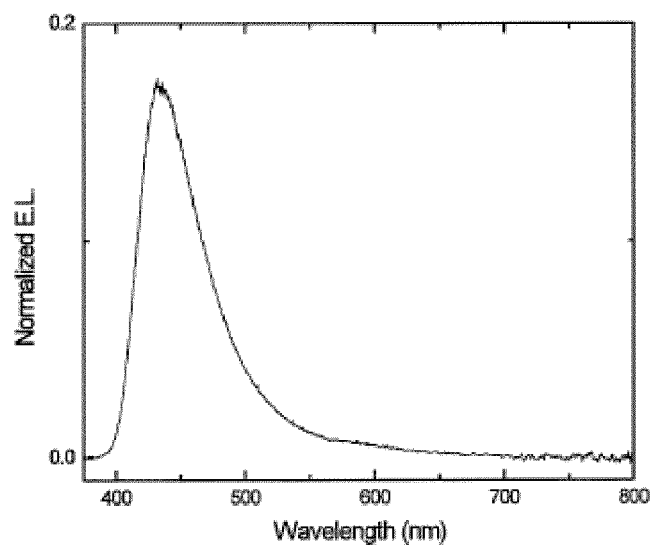
FIG. 11 shows a measured, normalized EL spectra for a second OLED.
Figure 12:
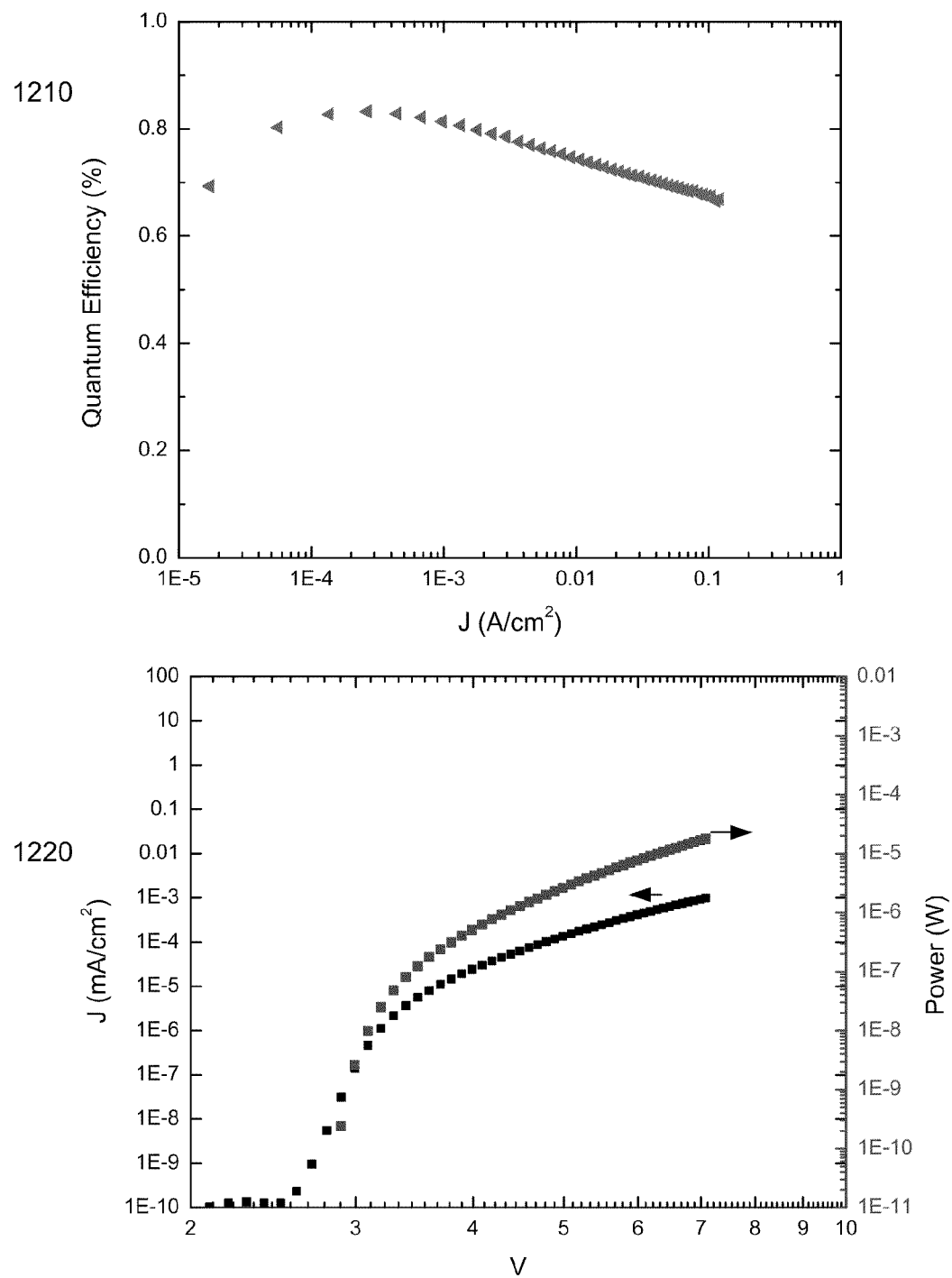
FIG. 12 shows plots characterizing the second OLED.

The sheet resistance of the ITO was measured to be 35Ω/□. The second OLED is a control device, similar to the first OLED but without the DBR. FIG. 11 shows a measured normalized EL spectrum for the second OLED. FIG. 12 shows a plot 1210 of measured quantum efficiency (QE) vs. current flux J (A/cm²), as well as a plot 1220 of power (W) and flux J (A/cm²) vs. voltage V for the second OLED.

Figure 13:
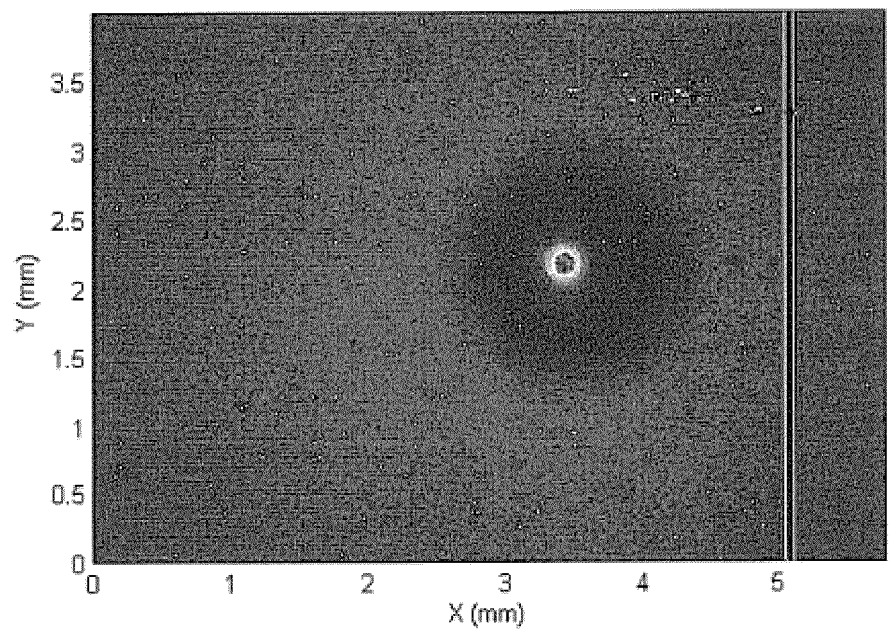
FIG. 13 shows the measured light output from a GRIN lens, where light is input from the first OLED.

An OLED having the structure of the first OLED was placed on a GRIN lens, with the glass substrate of the OLED in contact with an end of the GRIN lens. The GRIN lens had a diameter of 1 mm, an index $n_0=1.6073$, A=0.608, and pitch=¼ (corresponding to a length of 2.58 mm). FIG. 13 shows the measured light output from the GRIN lens. The light shows a factor of 20 in terms of reduced area and increased intensity relative to the input light. Thus, an OLED intensity of about 5 W/cm² is needed to reach an intensity of 100 W/cm² on an OSL with the specific configuration measured in FIG. 13. This corresponds to a 38 mW OLED having a 1 mm diameter. The OLED actually used was not 38 mW, but the increase in intensity demonstrates that intensities needed to drive an OSL can be achieved by focusing an OLED.

Figure 14:
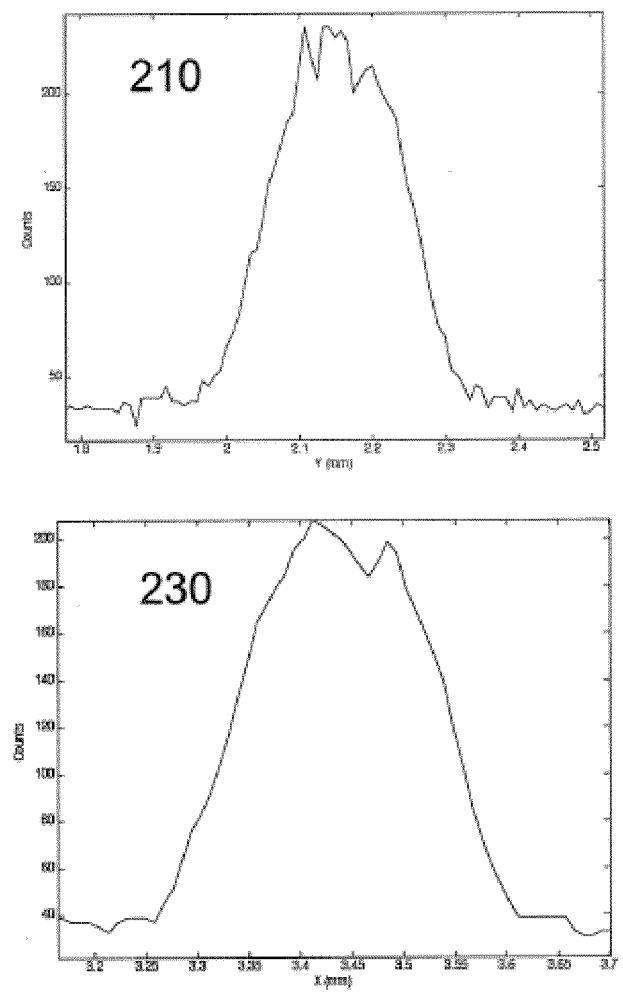
FIG. 14 shows cross sectional intensity profiles, in the X and Y directions, for the focal spot illustrated in FIG. 13.

FIG. 14 shows cross sectional intensity profiles, in the X and Y directions, for the focal spot illustrated in FIG. 13. The units are arbitrary.

Figure 15:
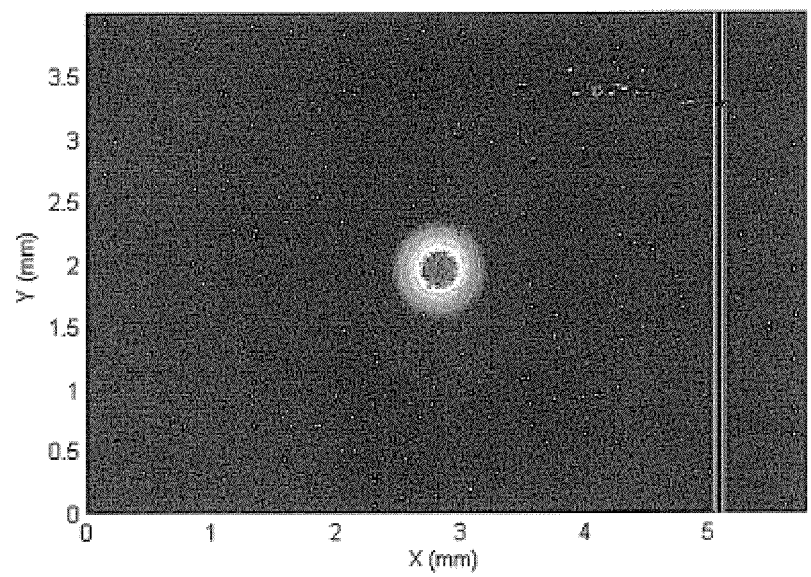
FIG. 15 shows the measured light output from a GRIN lens, where light is input from the first OLED.
Figure 16:
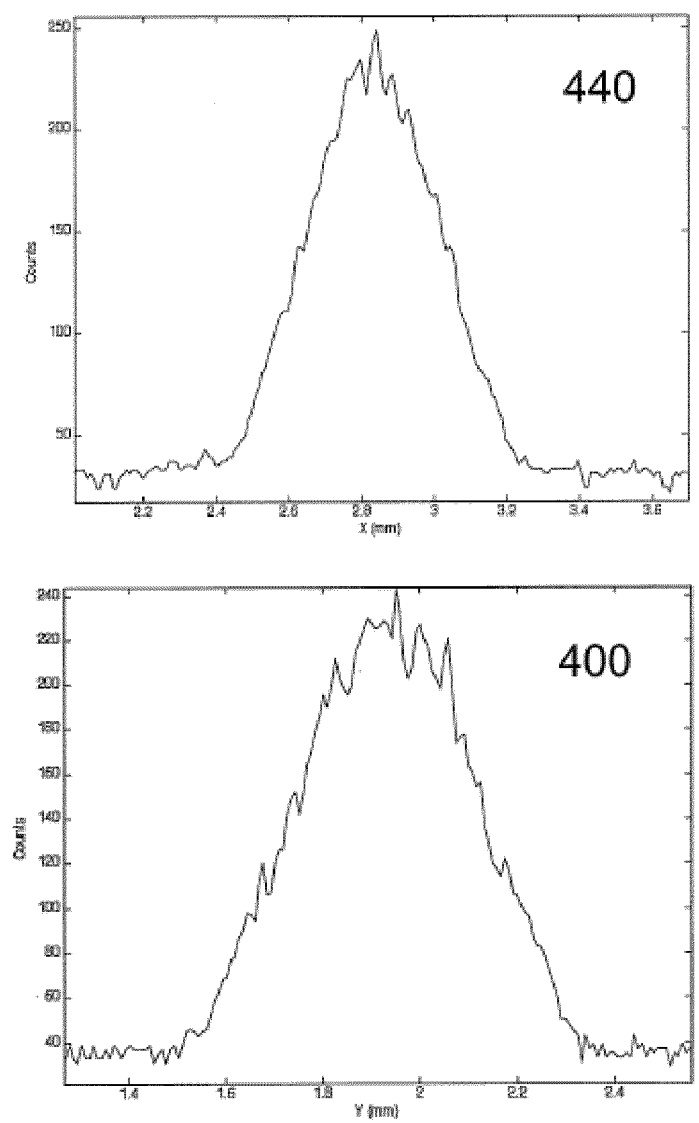
FIG. 16 shows cross sectional intensity profiles, in the X and Y directions, for the focal spot illustrated in FIG. 15.

An OLED having the structure of the first OLED was placed on a GRIN lens, with the glass substrate of the OLED in contact with an end of the GRIN lens. The GRIN lens had a diameter of 1.8 mm, and an index $n_0=1.6073$, A=0.339, and pitch=¼ (corresponding to a length of 4.63 mm). FIG. 15 shows the measured light output from the GRIN lens. The light shows a factor of 18 in terms of reduced area and increased intensity relative to the input light.

FIG. 14 shows cross sectional intensity profiles, in the X and Y directions, for the focal spot illustrated in FIG. 13. The units are arbitrary.

Figure 17:
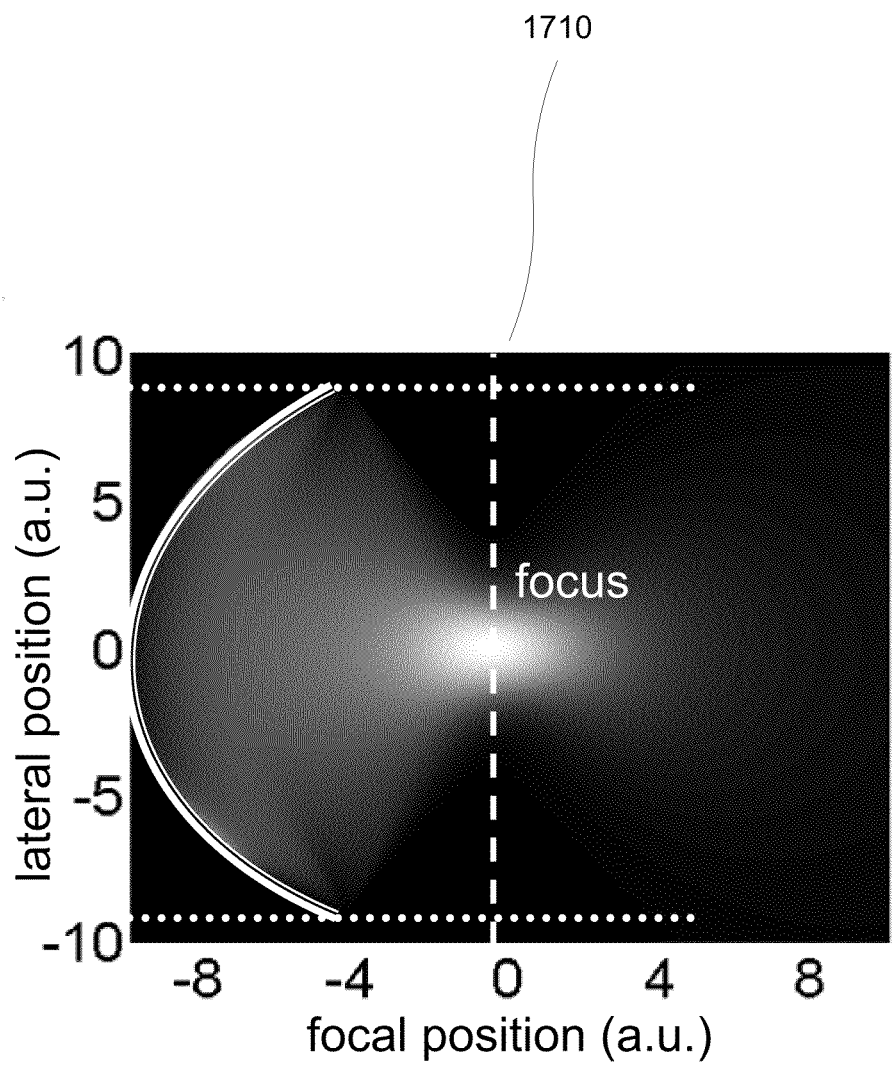
FIG. 17 shows a calculated intensity profile for a curved OLED similar to that of FIG. 5.

FIG. 17 shows a calculated intensity profile for a curved OLED similar to that of FIG. 5. The X and Y axes represent position in arbitrary units. Dashed line 1710 is a cross section across which data was taken for FIG. 18. FIG. 17 shows an increased intensity in a focal region, relative to the intensity of light output by the curved OLED.

Figure 18:
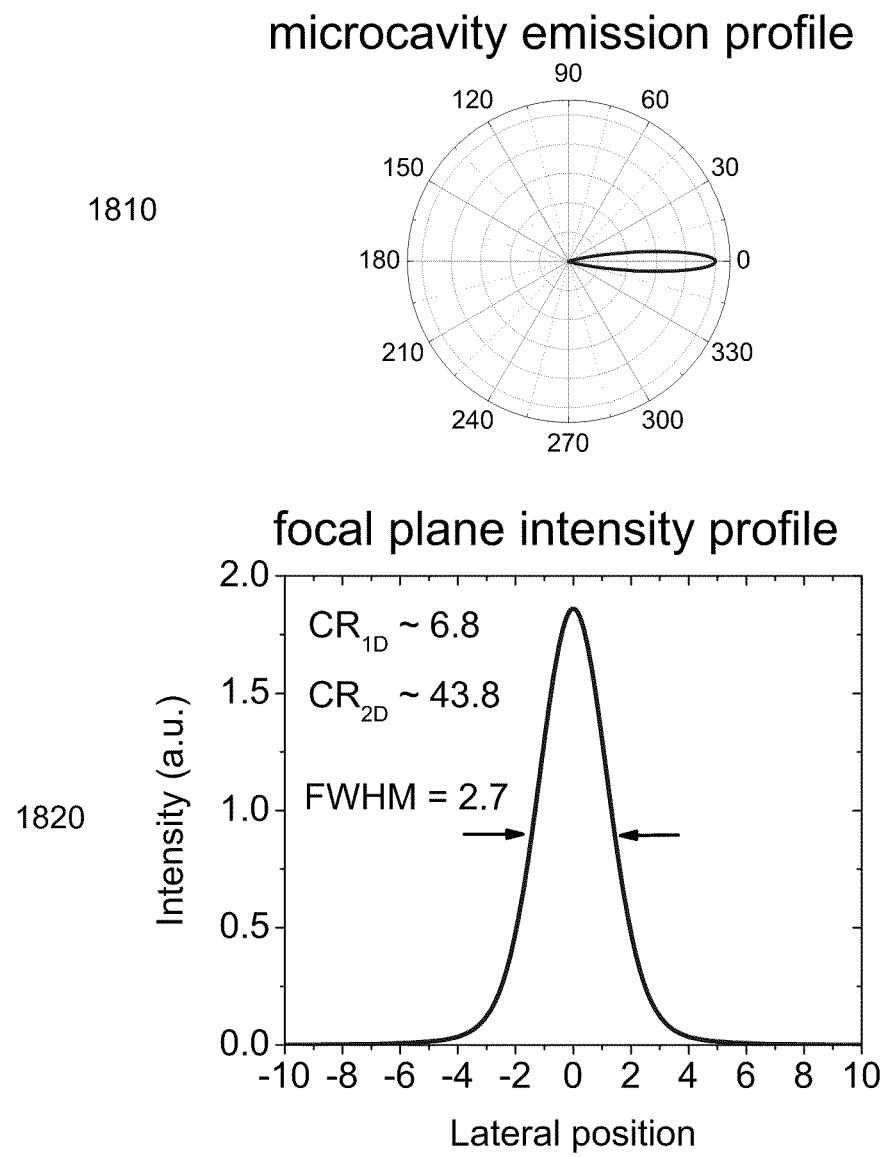
FIG. 18 shows intensity profiles for the OLED illustrated in FIG. 17

FIG. 18 shows intensity profiles for the OLED illustrated in FIG. 17. Microcavity emission profile 1810 shows an assumed collimated OLED output used in the calculations used to generate FIG. 17. Focal plane intensity profile 1820 shows intensity as calculated for various points on dashed line 1710 of FIG. 17. The intensity shown in intensity profile 1820 is in arbitrary units. For a 1-D microcavity, the intensity at the focus was 6.8 times that of the OLED intensity without focusing. For a 2-D microcavity, the intensity at the focus was 43.8 times that of the OLED intensity without focusing. A 1-D microcavity is a structure which possesses periodic refractive index variation along one dimension. Implementations include a distributed feedback grating (DFB) or a distributed Bragg reflector (DBR). A 2-D microcavity possesses a periodic index variation along two dimensions and is typically called a 2-D photonic crystal. Microcavities may tailor the emission pattern by creating discrete bands of allowed and disallowed optical modes. A properly designed aperiodic grating can also be used for such an application.

Figure 19:
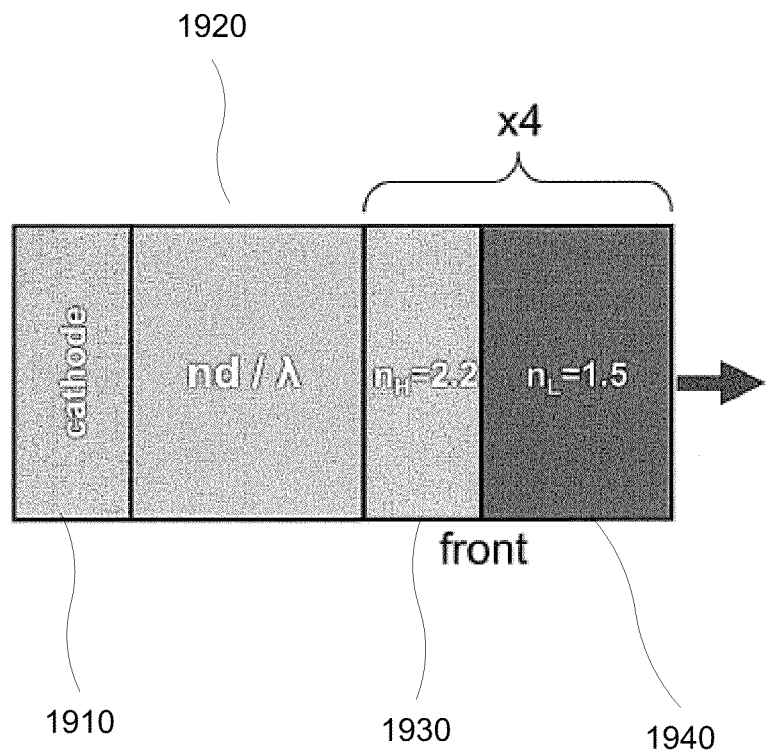
FIG. 19 shows an optical microcavity structure corresponding to an OLED.

FIG. 19 shows an optical microcavity structure corresponding to an OLED. The structure has a cathode 1910, organic layers 1920, and a DBR formed of alternating high index layer 1930 and low index layer 1940. It was assumed that the cathode is 100% reflective. The organic layers are characterized by a parameter useful for modeling, $nd/\lambda$, where n is the index of refraction, d is the thickness, and $\lambda$ is a wavelength of interest (such as the peak wavelength in the emissive spectrum of the OLED). It was assumed that the anode does not have a significant optical effect, so it is not illustrated in FIG. 19. The DBR is formed of four cycles of alternating high index layer 1930, having a refractive index $n_H$ of 2.2, and low index layer 1940, having a refractive index $n_H$ of 1.5. The structure illustrated in FIG. 19 was used in calculations resulting in the optical profiles illustrated in FIG. 20.

Figure 20:
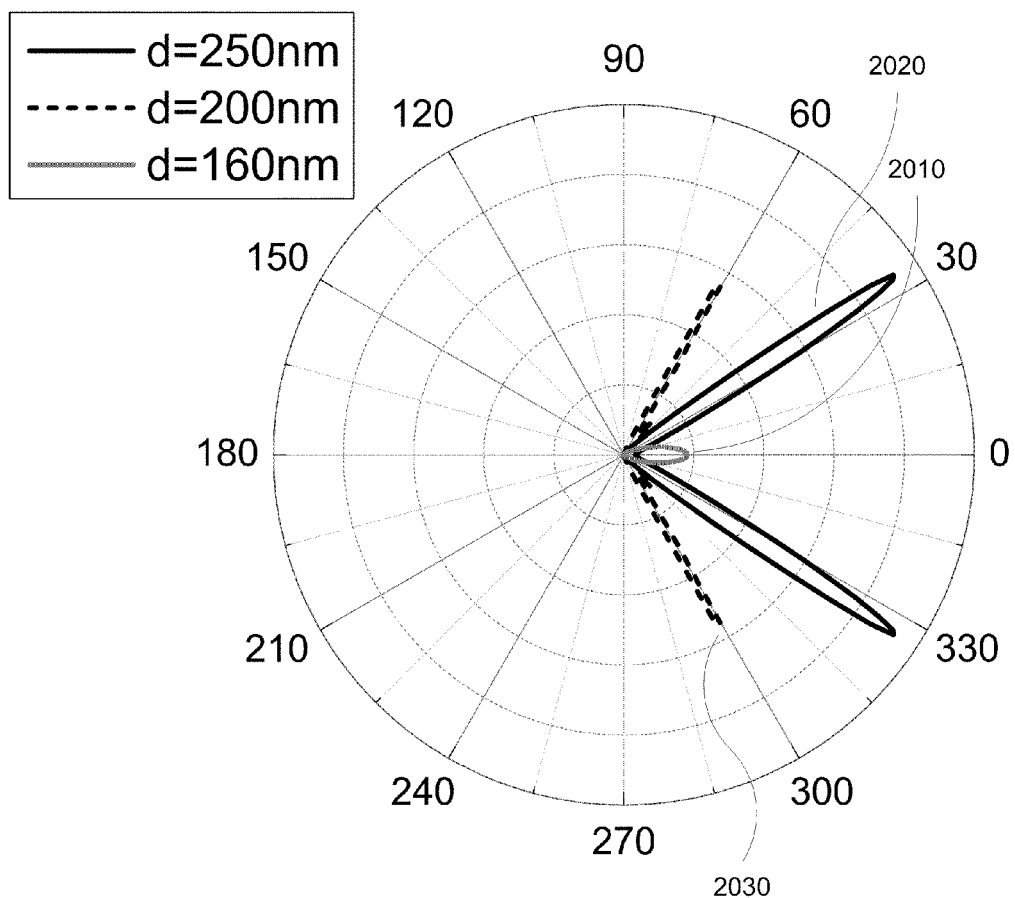
FIG. 20 shows several optical profiles based on the structure of FIG. 19.

FIG. 20 shows several optical profiles based on the structure of FIG. 19, making various assumptions. Plot 2010 shows highly collimated emission at an angle of zero, where $nd/\lambda$ is 0.45, d is 160 nm, and $\eta$, the outcoupling efficiency, is 7%. Plot 2020 shows highly collimated emission, but in directions not normal to the surface of the OLED, where $nd/\lambda$ is 0.56, d is 250 nm and $\eta$ is 50%. Plot 2030 shows highly collimated emission, where $nd/\lambda$ is 0.7, d is 200 nm and $\eta$ is 40%. FIG. 20 shows that microcavity effects may vary depending on various parameters. These parameters may be readily selected by one of skill in the art to obtain a desired microcavity effect.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The figures generally may not be drawn to scale.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device, comprising:
   a first organic light emitting device, further comprising:
      a first electrode;
      a second electrode; and
      an organic emissive layer disposed between the first electrode and the second electrode;
   a first laser device, further comprising:
      an optical cavity; and
      an organic lasing material disposed within the optical cavity; and
   a focus mechanism disposed to focus light emitted by an area of the first organic light emitting device onto an area of the first laser device, such that the area of the first laser device is smaller than the area of the first organic light emitting device.

2. The device of claim 1, wherein the focus mechanism is adapted to focus light emitted by the first organic light emitting device onto the first laser device such that the intensity of light incident on the first laser device is at least 10 times greater than the intensity of light emitted by the first organic light emitting device.

3. The device of claim 2, wherein the focus mechanism is adapted to focus light emitted by the first organic light emitting device onto the first laser device such that the intensity of light incident on the first laser device is at least 100 times greater than the intensity of light emitted by the first organic light emitting device.

4. The device of claim 1, wherein the first organic light emitting device further comprises a microcavity, such that the organic emissive layer is disposed within the microcavity.

5. The device of claim 4, wherein the microcavity is a one-dimensional microcavity.

6. The device of claim 4, wherein the microcavity is a two-dimensional microcavity.

7. The device of claim 1, wherein the focus mechanism is a lens.

8. The device of claim 7, wherein the lens is a gradient index lens.

9. The device of claim 8, wherein the lens is a quarter pitch gradient index lens.

10. The device of claim 8, wherein the gradient index lens has a cylindrical shape having a first planar end and a second planar end, and wherein the first organic light emitting device is disposed on the first planar end of the gradient index lens, and the first laser device is disposed on the second planar end of the gradient index lens.

11. The device of claim 1, wherein the focus mechanism is a non-planar substrate on which the first organic light emitting device is disposed, such that light from the first organic light emitting device is focused into a region in which at least a part of the first organic semiconductor laser is disposed.

12. The device of claim 11, wherein the non-planar substrate has three dimensional curvature.

13. The device of claim 11, wherein the non-planar substrate has a parabolic shape.

14. The device of claim 1, further comprising circuitry adapted to pulse the first organic light emitting device.

15. The device of claim 1, further comprising a consumer device into which the device of claim 1 is incorporated.

16. A method, comprising:
   electrically driving a first organic light emitting device, the first organic light emitting device further comprising:
      a first electrode;
      a second electrode; and
      an organic emissive layer disposed between the first electrode and the second electrode;
   optically pumping a first laser device by focusing light emitted by an area of the first organic light emitting device onto organic lasing material of an area of the first laser device, the first laser device further comprising:
      an optical cavity; and
      an organic lasing material disposed within the optical cavity, such that the area of the first laser device is smaller than the area of the first organic light emitting device.

17. The method of claim 16, wherein the first organic light emitting device is driven in pulses, such that the first laser device is optically pumped in pulses.

18. The method of claim 17, wherein the pulses have a length of 5 to 20 nanoseconds.

19. The method of claim 17, wherein an interval between pulses has a length of at least one microsecond.

* * * * *